(12) United States Patent
Halter

(10) Patent No.: US 7,114,827 B2
(45) Date of Patent: Oct. 3, 2006

(54) LIGHTING ASSEMBLY

(75) Inventor: Michael A. Halter, Conway, AR (US)

(73) Assignee: Syair Designs LLC, Huntington Beach, CA (US)

( * ) Notice: Subject to any disclaimer, the term of this patent is extended or adjusted under 35 U.S.C. 154(b) by 230 days.

(21) Appl. No.: 10/802,145

(22) Filed: Mar. 17, 2004

(65) Prior Publication Data

US 2004/0183480 A1    Sep. 23, 2004

Related U.S. Application Data

(60) Provisional application No. 60/455,269, filed on Mar. 17, 2003, provisional application No. 60/455,129, filed on Mar. 17, 2003, provisional application No. 60/455,126, filed on Mar. 17, 2003, provisional application No. 60/455,127, filed on Mar. 17, 2003.

(51) Int. Cl.
*F21V 21/00* (2006.01)

(52) U.S. Cl. .................. 362/219; 362/391; 362/249

(58) Field of Classification Search ............... 362/219, 362/800, 391, 85, 640, 647, 652, 653, 655, 362/656, 145, 249; 439/117, 436

See application file for complete search history.

(56) References Cited

U.S. PATENT DOCUMENTS

| 4,855,882 | A | * | 8/1989 | Boss ........................... 362/238 |
| 5,045,981 | A | * | 9/1991 | Nagano ....................... 362/219 |
| 5,317,292 | A | | 5/1994 | Leeb |
| 5,373,109 | A | | 12/1994 | Argyrakis et al. |
| 5,420,482 | A | | 5/1995 | Phares |
| 5,631,446 | A | | 5/1997 | Quan |
| 6,016,038 | A | | 1/2000 | Mueller et al. |
| 6,020,559 | A | | 2/2000 | Maeda |
| 6,055,722 | A | | 5/2000 | Tighe et al. |
| 6,150,774 | A | | 11/2000 | Mueller et al. |
| 6,166,496 | A | | 12/2000 | Lys et al. |
| 6,211,626 | B1 | | 4/2001 | Lys et al. |
| 6,292,901 | B1 | | 9/2001 | Lys et al. |
| 6,340,868 | B1 | | 1/2002 | Lys et al. |
| 6,501,166 | B1 | | 12/2002 | Wood et al. |
| 6,528,954 | B1 | | 3/2003 | Lys et al. |
| 6,548,967 | B1 | | 4/2003 | Dowling et al. |
| 6,577,080 | B1 | | 6/2003 | Lys et al. |
| 6,592,245 | B1 | * | 7/2003 | Tribelsky et al. ........... 362/551 |
| 6,608,453 | B1 | | 8/2003 | Morgan et al. |
| 6,624,597 | B1 | | 9/2003 | Dowling et al. |

OTHER PUBLICATIONS

MAX5258/MAX5259 Data Sheet, Maxim Integrated Products, Sunnyvale, CA (2001).
Application Note, "SPI Interface Used in a Daisy-Chain," Infineon Technologies AG, Munich, Germany (2000).
LM2674 Simple Switcher Power Converter High Efficiency 500 mA Step-Down Voltage Regulator Data Sheet, Naitonal Semiconductor Corporation, Santa Clara, CA (2001).

* cited by examiner

*Primary Examiner*—Thomas M. Sember
(74) *Attorney, Agent, or Firm*—J. Charles Dougherty

(57) ABSTRACT

A lighting assembly that is modular and highly configurable is disclosed. The assembly consists of one or more light fixtures that are fitted into a mounting rail. A flat, flexible cable lies within the rail and makes contact with the light fixtures through spring-loaded connectors. A power conditioning unit supplies power to the lighting assembly. The lighting assembly may be assembled and maintained with a minimum of tools, and is adaptable to a wide variety of environments and lighting design options.

17 Claims, 2 Drawing Sheets

LIGHTING ASSEMBLY

CROSS-REFERENCE TO RELATED APPLICATIONS

The present application claims the benefit of U.S. provisional patent applications Ser. Nos. 60/455,269, entitled "Spectrally Calibratable Multi-Element RGB LED Light Source"; 60/455,129, entitled "Indirect Lighting System Architecture and Implementation"; 60/455,126, entitled "Anisotropic Etching of Silicon Wafer Materials to Create Micro-Reflector Cavities for LED Die"; and 60/455,127, entitled "Micro-Strip-Line Signal and Power Buss Flexible Cable and Method of Using Same," each of which was filed on Mar. 17, 2003, and for each of which the inventor is Michael A. Halter. The present application is further related to the three co-pending applications filed on even date herewith entitled "Spectrally Calibratable Multi-Element RGB LED Light Source," "Anisotropic Etching of Silicon Wafer Materials to Create Micro-Reflector Cavities for LED Die," and "Micro-Strip-Line Signal and Power Bus Flexible Cable and Method of Using Same," the inventor for each of which is Michael A. Halter. The entire disclosure of each of the foregoing provisional and non-provisional applications are incorporated herein by reference.

BACKGROUND OF THE INVENTION

The present invention is directed to lighting assemblies, and in particular to a lighting assembly system that is highly configurable using standardized, easy-to-assemble and maintain components.

Indirect or "wash" lighting systems are used for a vast array of indoor and outdoor applications today. These applications include the use of such lighting systems on corporate and commercial aircraft, as well as on luxury yachts and watercraft. In these environments, the wash lighting system is a critical component of the entertainment and control systems of the craft. An ideal wash lighting system in such environments would be capable of different settings depending upon the section of the cabin or cabins and the mood or activity of the occupants. For example, studies have shown that people prefer a brighter, bluer light with which to read, while a softer, redder light is preferred at mealtimes. In addition, different light settings might be used at different times of day or in different areas of the cabins of such craft, depending upon the particular application.

Existing wash lighting systems for aircraft and watercraft are based on incandescent or, more commonly, fluorescent light sources. Fluorescent tube lights are bulky themselves, and also require bulky and heavy high-voltage ballasts in order to operate. Such lights also require extensive cabling, connectors, and wiring, particularly if the lights are to be separately controllable to achieve different lighting effects in different areas of the cabin. The bulk of the tubes, ballasts, and cabling required for fluorescent lighting occupies significant space that could otherwise be used for passenger headroom or storage, which is an especially critical issue in aircraft cabin design. In addition, fluorescent lights are difficult and costly to maintain. Fluorescent tubes, while typically exhibiting a useful life longer than that of incandescent bulbs, must still be replaced fairly frequently.

In addition, the high-voltage ballasts required for the installation of fluorescent lights produce electromagnetic interference/radio frequency interference (EMI/RFI) that may interfere with aircraft or watercraft communication or navigation systems. The interference produced by these devices must be carefully considered by aircraft designers, and appropriate electromagnetic shielding must be used to protect sensitive equipment. In the case of communications equipment, complete shielding may not be possible. In any event, the necessary shielding further increases the weight and space requirements, as well as the costs, associated with the use of fluorescent wash lighting systems.

There are significant limitations on the variation in light type and quality that may be achieved using fluorescent lights. A single fluorescent tube can only produce light of one color and of a very limited intensity band. Thus if different lighting effects are to be achieved in the same cabin or area, multiple tubes (and hence multiple ballasts and multiple sets of cabling, connectors, and other components) must be installed for this purpose. As a result, significant use of lighting effects is impractical in most current installations using fluorescent tube lighting designs.

Another limitation of fluorescent tube lighting systems is that a smooth light output across the lighted surface cannot be achieved. To achieve a smooth light output when multiple light sources are used, the light sources must be placed directly next to each other. For example, in order to achieve a smooth line of light with fluorescent tubes, the tubes would need to be placed directly end-to-end with each other. Due to the practical limitations of fluorescent tube design, this is not possible. Placing fluorescent tubes end-to-end would necessarily result in "dark spots" at the gap between the tube ends.

What is desired then is a lighting system that is highly configurable, allows a wide variety of lighting effects, reduces weight and space usage over existing lighting systems, is easy and inexpensive to install and maintain, can produce a smooth lighted surface when multiple light sources are employed, and is modular in form to allow many different installation configurations depending upon the application or desire of the user.

BRIEF SUMMARY OF THE INVENTION

The present invention is a wash lighting assembly based preferably on light emitting diode (LED) illumination sources that overcomes the limitations of prior art (primarily fluorescent) wash lighting systems. The present invention is particularly well-suited to a myriad of applications due to its modular, highly configurable design. In one embodiment, the present invention consists of five basic elements: (1) a support rail; (2) wash lighting fixtures mounted on the support rail; (3) a single flat cable used for both power and data signals; (4) power conditioning supply units; and (5) a processor to generate control data signals. The support rail, lighting fixtures, and flat cable are integrated into a single, streamlined unit whose length is dynamically configurable as needed in a particular application. Light is produced evenly across the entire top surface of the fixture, so multiple fixtures strung end-to-end along the rail produce a smooth line of light. In the preferred embodiment, the cable is hidden and protected within the support rail, while the lighting fixtures snap fit into the rail with spring-loaded contacts on their bottom side, forming a pressure connection between power and data connectors on the fixture and cable. A failed fixture may be simply snapped out and replaced with a new fixture.

The present invention offers a number of advantages over existing systems. The use of a single, flexible cable for the distribution of power and data communications to each wash light fixture allows one connection in the aircraft, watercraft, or other main system source to service the entire wash light assembly. Thus the vast bundles of cables, connectors, and related components in existing systems are eliminated. No interconnections between lighting systems in the system are required. This results in considerable savings in lighting system design, installation labor, and overall system weight. In addition, because there are no high-voltage components in the system, and thus no high-voltage wire interconnections, the electromagnetic interference problems created by fluorescent lighting systems are eliminated.

Despite resulting in a lighting system of considerably reduced weight and installation complexity, the present invention allows far greater controllability and lighting effects options than any existing wash lighting system. Each lighting fixture in the overall lighting system may be individually controlled, or sections of lights may be split into individually-controlled sections. For example, a simple application would be to split the lights into a forward and aft cabin section for separate control. In addition, many sorts of more complex controls may be employed, such as achieving a spectrum of color or intensity across a cabin section by slightly varying the color or intensity from lighting fixture to lighting fixture along the rail. Using an eight-bit control system according to the preferred embodiment, each individual LED light fixture, which consists of red, green, and blue LEDs, may be configured to produce one of over sixteen million different colors. Any desired aspect of mood or setting lighting can thus be precisely achieved.

The use of a long rail for installation according to the preferred embodiment allows the light output across a cabin area to appear perfectly smooth. Preferably, lighting fixtures are set into the rail end-to-end, such that there are no gaps in the light output across the length of the mounting rail. The result is an even distribution of light when the controls are set for each lighting fixture to produce light of the same color and intensity. Dramatic effects can be achieved by varying the light color or intensity across the fixtures on a single rail, producing the effect of a smooth light spectrum change across the rail length.

Other advantages flow directly from the employment of LED lighting fixtures. The expected life of the LEDs in a typical installation is 50,000 hours, far surpassing other lighting technologies. In addition, since the system consists of solid state components instead of glass bulbs or tubes, breakage is much less likely, and the likelihood of injury resulting from such breakage is thereby lessened. In addition, the light source is very clean, without stray emissions outside of the visible spectrum. As a result, the system produces no infrared emissions that could interfere with infrared remote control and communications systems employed within the cabin or other area where the light system is installed, and produces no ultraviolet light that could cause furniture coverings and fabrics to deteriorate.

Another design advantage associated with the present invention is the flexibility of cabin design the invention affords to aircraft and watercraft cabin designers. Using traditional lighting systems, floor plans that accommodate split cabin designs and other lighting definitions must be coordinated in advance and engineered into the design. Where multiple lighting zones are required, separate control modules must be added in support of each zone. Because the preferred embodiment of the present invention comprises separately addressable lighting fixtures, "virtual" cabin partitions can be created with lighting effects, which can be modified as desired simply through software controls in the system.

The present invention also provides a highly fault-tolerant lighting system. Because of the modular design and use of separate wash lighting fixtures, the failure of one fixture does not affect the operation of any of the other fixtures in the system. A failed fixture can simply be removed for repair or disposal. If a spare fixture is available it may be inserted, but the other fixtures in the system will continue to function normally even if the failed fixture is not replaced. In addition, the embedded processor in the lighting fixtures of the preferred embodiment of the present invention allows for diagnostic features such as error messages to help quickly identify problems. Since each fixture is separately addressable, they may each be periodically polled if desired to ensure proper function and communication as part of the control system. Maintenance information, such as the number of hours each fixture operates, may be stored for later study.

Thus it is an object of the present invention to provide a lighting system that allows for interconnection between lighting fixtures using only a single cable.

It is a further object of the present invention to provide a lighting system of significantly reduced weight and bulk compared to previous fluorescent lighting systems.

It is a further object of the present invention to provide a lighting system that does not produce high-frequency or electromagnetic interference.

It is a further object of the present invention to provide a lighting system that is highly modular for ease of design, installation, and maintenance.

It is a further object of the present invention to provide a lighting system with individually controllable lighting fixtures.

It is a further object of the present invention to provide a lighting system with a widely configurable color and intensity output for each lighting fixture.

It is a further object of the present invention to provide a lighting system with lighting fixtures having a long life, and thus reduced maintenance requirements.

It is a further object of the present invention to provide a lighting system that does not incorporate glass bulbs or tubes, thereby improving the durability of the system.

It is a further object of the present invention to provide a lighting system that allows a smooth distribution of light output across multiple lighting fixtures, without "hot" or "cold" spots between fixtures.

It is a further object of the present invention to provide a lighting system that has a clean light output, without stray emissions outside of the visible spectrum.

It is a further object of the present invention to provide a lighting system that eliminates the need for high-voltage ballasts or other high-voltage supplies or transformers.

It is a further object of the present invention to provide a lighting system that allows the creation of "virtual" zones or compartments across a cabin or other area through the use of varying lighting effects.

It is a further object of the present invention to provide a lighting system that remains operable despite the failure or removal of one or more lighting fixtures from the system.

It is a further object of the present invention to provide a lighting system with diagnostic capabilities whereby problems with an individual lighting fixture may be readily identified.

These and other features, objects and advantages of the present invention will become better understood from a consideration of the following detailed description of the preferred embodiments and appended claims in conjunction with the drawings as described following.

DETAILED DESCRIPTION OF THE INVENTION

Figure 1:
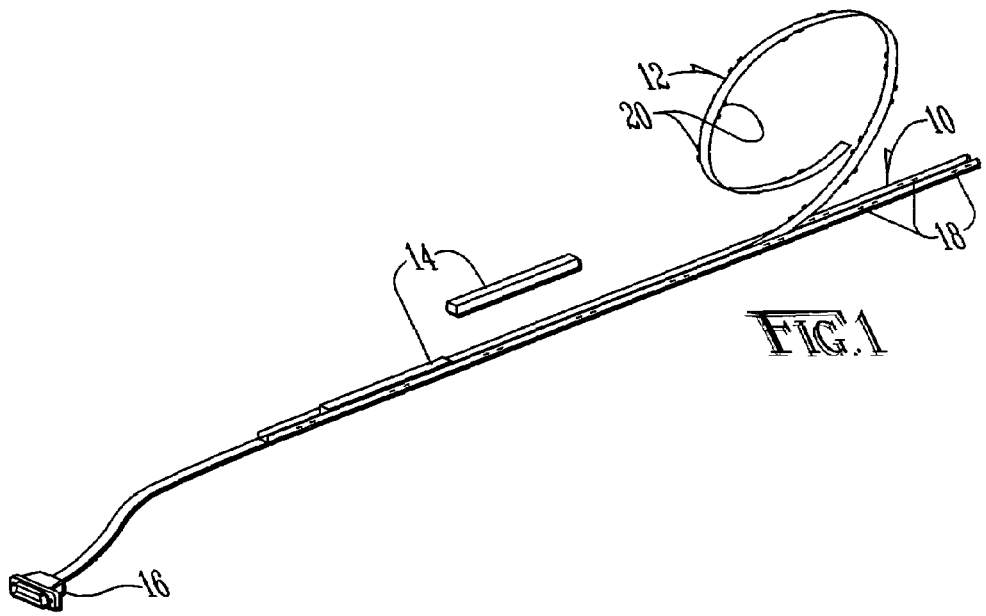
FIG. 1 is a perspective view of certain components of a preferred embodiment of the present invention.

Referring now to FIG. 1, a preferred embodiment of the present invention for use within the cabin sections of an aircraft or watercraft may now be described. Rail 10 is generally of an elongated, U-shaped design, and is shaped so as to receive cable 12 and lighting fixtures 14. Rail 10 is preferably formed of stainless steel, but may alternatively be formed of any other sufficiently strong and rigid metal or other material in order to provide a strong and durable attachment point for the lighting system within the cabin of an aircraft or watercraft. Stainless steel is the preferred material because its strength reduces the possibility of damage created by pressure and bending of components during installation and maintenance, or when bumped or struck by persons within the cabin during routine use of the craft. In a preferred embodiment, each rail 10 is manufactured to a length of 24 inches, but may be cut to length as needed in the field, preferably in increments to match the length of individual fixtures 14. Each of rails 10 are preferably designed to be flush fitting when mounted end-to-end, and are provisioned with guide tabs to aid alignment during installation. Rails 10 may also be provisioned with mounting holes (not shown) to be used for securing the rails within the cabin of an aircraft or watercraft by screws, bolts, or other standard connectors.

Flexible flat cable 12 is used to distribute both power and data bus communications to lighting fixtures 14 of the preferred embodiment. Cable 12 is formed of multiple layers of conductors and insulators, and preferably has all connection points formed as pads on its upper surface. In the preferred embodiment, flexible flat cable 12 may be up to 32 feet in length, the maximum length being dependent upon the resistance and other electrical characteristics of conductors within flexible flat cable 12. Cable 12 preferably includes a "tail" section that is provisioned with a standard electrical connector 16. Connector 16 is used to connect cable 12 to the power and data network of the aircraft, watercraft, or other system.

Rails 10 have along their bottom side cut-outs 18 to receive securing tabs 20 of cable 12. Securing tabs 20 allow cable 12 to snap into place within each rail 10 and be held in place flat against the bottom of rails 10 for receiving fixtures 14. Tabs 20 and cut-outs 18 are preferably "keyed," that is, cut in an asymmetrical shape such that cable 12 may be mounted within rail 10 in only one direction. This reduces the likelihood of an error when mounting cable 12 within rail 10. Gold-plated pads (not shown) located on the top side of cable 12 provide electrical connections to lighting fixtures 14. All necessary power and data bus communications connections to each fixture 14 are supplied through cable 10.

The fixtures 14 are preferably positioned and locked into rail 10 end-to-end, thereby creating long lengths of wash lighting. As shown in FIG. 3B, spring-loaded contacts 22 on the bottom side of each fixture 14 form the electrical connection with the conductors within cable 12. In the preferred embodiment, there are sufficient spring-loaded contacts 22 allowing for power, ground, and three serial communication signals passing through cable 12 to each fixture 14. Fixtures 14 are locked into place within rail 10 by sliding fixture locking pins 24 into matching locking holes (not shown) in the sides of rail 10. Like the cut-outs 18 and matching tabs 20 of cable 12, pins 24 and the matching locking holes are preferably "keyed" so that each fixture 14 may be mounted in rail 10 in only one direction. This ensures that each fixture 14 is mounted within rail 10 such that the spring-loaded contacts 22 align properly with the pads of cable 12 in order for power, ground, and data signals to pass to and from each fixture 14. If a fixture 14 needs to be removed, a special extractor tool (not shown) may be used. This tool is operable to depress pins 24, thereby releasing the locking mechanism and allowing the fixture 14 to be removed from rail 10. Therefore, only the fixture 14 that needs to be serviced is removed, while other fixtures 14 remain in place and operable.

Figure 3A:
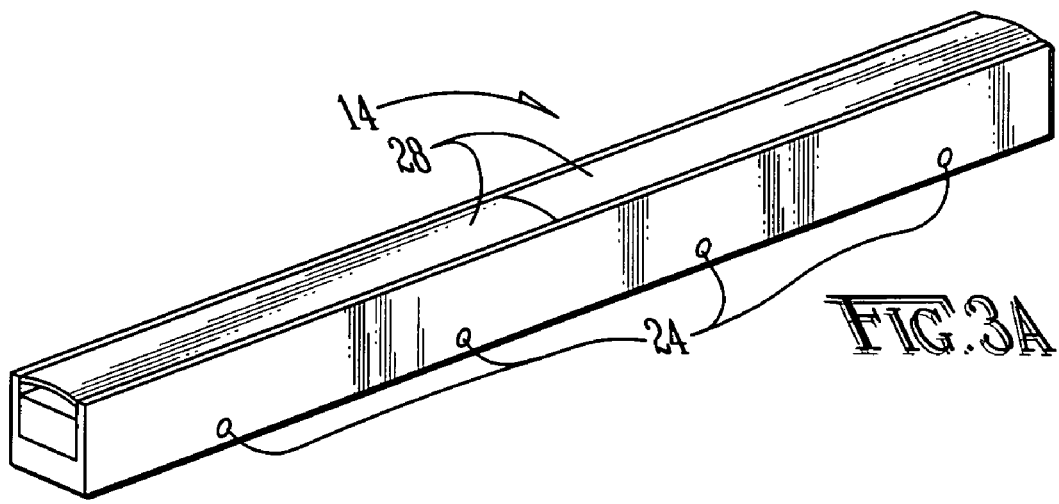
FIG. 3a is a perspective view of the upper side of a lighting fixture according to a preferred embodiment of the present invention.
Figure 3B:
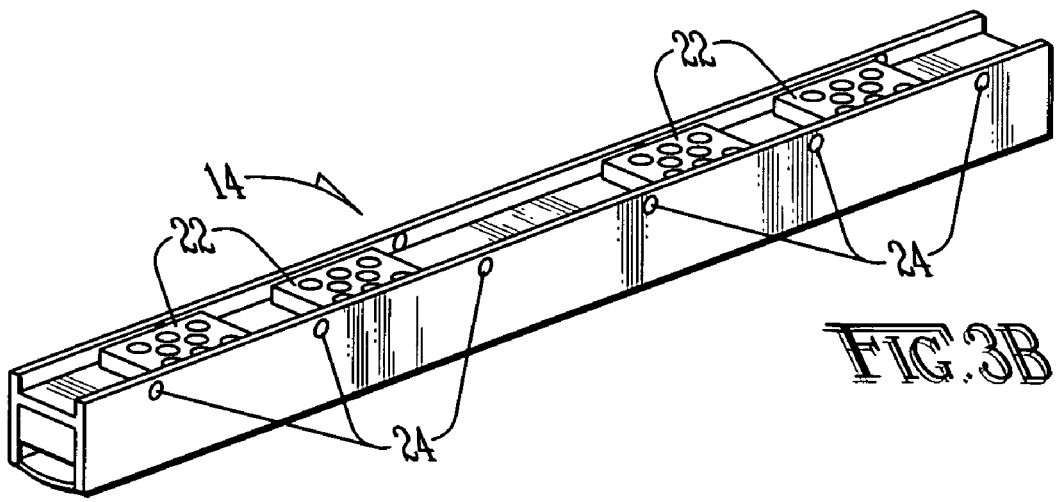
FIG. 3b is a perspective view of the lower side of a lighting fixture according to a preferred embodiment of the present invention.

It should be noted that each fixture 14, as shown in FIGS. 3A and 3B, is a completely integrated lighting fixture unit. The lamp and control circuitry are contained within fixture 14, eliminating the mounting of separate ballasts, control boxes, and relays necessary with traditional lighting systems. Full control of each light fixture 14 for on/off, intensity and color control, calibration, run-time clocks, diagnostics as well as many other features are accessed or controlled directly over a serial communication network through cable 12.

In the preferred embodiments of the invention, light fixtures in lengths of three, six, and twelve inches are employed to further provide a modular approach to cabin lighting. Long lengths of light are created by simply snapping multiple fixtures 14 end-to-end within a length of rails 10. The standard wash light fixture lengths of three, six, and twelve inches are constructed using an appropriate number of three-inch LED light modules 28; two modules 28 are used to form a six-inch fixture 14 in FIG. 3A, for example. Multiple modules 28 are thus mounted end-to-end to make up the lengths of each fixture 14. By way of further example, a twelve-inch fixture 14 utilizes four LED light modules 28.

Each three-inch LED light module 28 consists of a set of silicon wafers populated with LEDs arranged in red-green-blue (RGB) clusters. These RGB clusters permit the color output of the modules to be electronically and dynamically changed with over 16 million colors being capable of being produced from each module 28 using an eight-bit control system. Specifically, an eight-bit control signal would allow each LED color to take on 256 different intensity settings, with there thus being more than 16 million possible color combinations produced by the module 28. Each three-inch LED light module 28 further preferably contains electronic circuitry to permit each module's color to be calibrated to match the color and intensity of the other modules 28 making up the fixture 14, or to a reference light, as well as to match the color and intensity of all the fixtures 14 comprising the entire wash lighting system.

Each of the fixtures 14 preferably include all supporting electronic and software components to permit an interface to the fixture 14 to be made using a serial data bus. Each fixture 14 contains a dedicated microcontroller which provides dimming and color control of the fixture via serial communication to a processor through a cabin control network interface module (not shown). On/off, dimming, and color control are all accomplished internally to each fixture 14. Each fixture 14 is individually addressable, which permits single continuous runs of wash lights to be split into multiple sections for control, such as forward and aft cabin section controls. This would allow, for example, one area of the cabin to be designated for reading, with the application of a bluer white section of light; another section for dining, with a redder white section of light; and a third section for resting, with a significantly dimmer section of light.

Each fixture 14 also stores a unique digital identifier, which can be polled by the processor, thereby permitting each module to be uniquely identified by lighting family (wash, dome, reading, or accent, for example, where other lights form a part of the system) as well as lighting type within each family (3", 6" or 12" wash light, for example). Each lighting fixture 14 is also further digitally identified with a manufacturing information such as serial number, date of manufacture, and number of hours in service. These features permit each fixture 14, as well as other devices within the system, to be uniquely identified by a serial number.

It may be noted that in alternative embodiments of the present invention, other types of lighting fixtures can also electrically interconnect to cable 12 in rail 10 using a specially designed connector mechanism, which engages the pads on cable 12 in a similar manner as the spring-loaded contacts 22 of modules 14. For example, a hanging lamp that incorporates a mounting point with pins similar to locking pins 24 of modules 14 could be used. Dome lights, reading lights, accent lights, or other forms of lighting could thus be plugged directly into a rail and form a part of the overall lighting system as desired.

Figure 2:
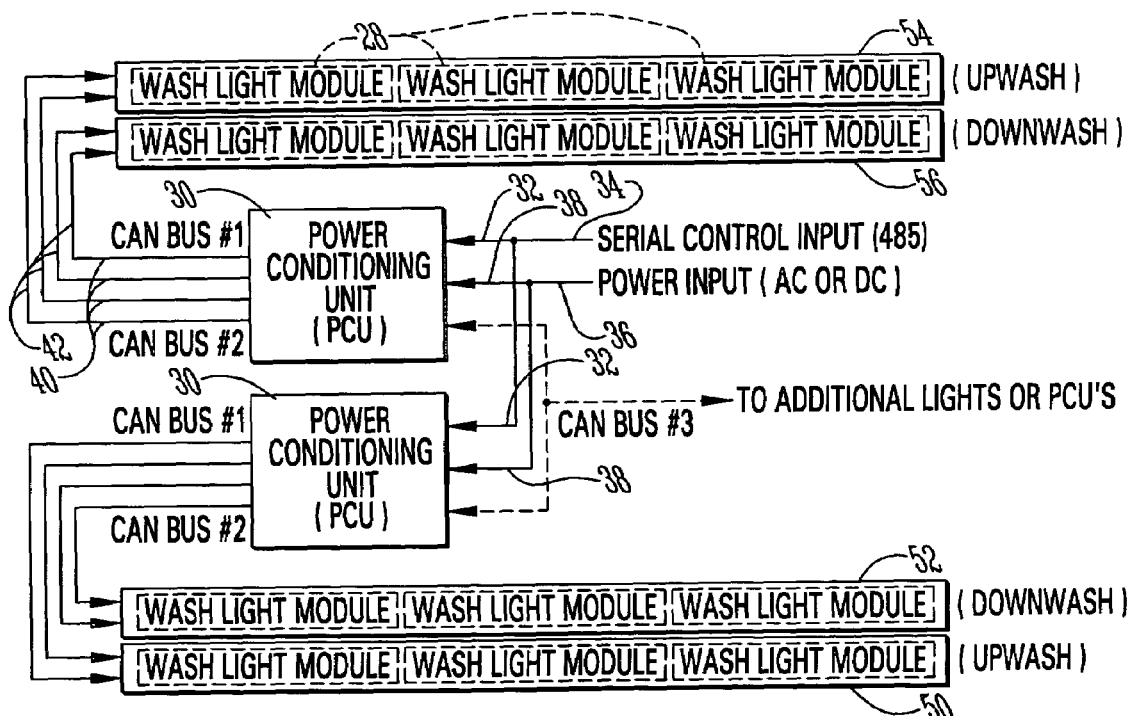
FIG. 2 is a schematic diagram showing certain components of a preferred embodiment of the present invention.

Referring now to FIG. 2, the power and control network for a preferred embodiment of the present invention may be described. Power is preferably provided to wash light fixtures 14 through dedicated power conditioning unit (PCU) 30 but may also be provided directly from the craft main power system. The purpose of PCU 30 is to provide clean, reliable power to wash light fixtures 14. Units suitable for use as PCUs 30 are available in both AC and DC input versions with both versions providing a conditioned 28VCD for the lighting fixtures.

In the preferred embodiment, fixtures 14 draw power at 28VDC from PCUs 30. PCUs 30 preferably condition the power provided by the aircraft or watercraft main power system, either AC or DC, to a conditioned 28VDC supply for the lighting system. The power and ground interconnection between a PCU 30 and lighting fixtures 14 is made through cable 12. PCU 30 also provides the interface to the processor or other lighting management and control system over the data lines of cable 12. This arrangement provides an efficient means of control, eliminating the need for external relays and control modules. PCU 30 also accepts discrete control inputs for non-data bus control.

A Network Interface Module (NIM) (not shown) is preferably integrated into each PCU 30. Each NIM contains the electronics and communication hardware to control the wash lighting system, store presets, assign/set logical lighting groups and other control features. The wash lighting serial data bus is directly connected to the NIM module within PCU 30. The NIM, in turn, communicates with the "outside world" via serial data bus and discrete input control. Discrete general purpose inputs (GPIs) are preferably available as part of the NIM for non-data bus control of the wash light system. Each NIM preferably provides eight general purpose inputs which are both hardware and software configurable. Each GPI can be configured through hardware to respond to active high, active low or as variable voltage inputs. The GPIs can also be configured through software to any one of twelve pre-programmed configurations. Each of these configurations can further be programmed to act upon any individual fixture 14 within the lighting system or to a user defined group or groups of fixtures 14 within the entire lighting system network. These features permit complex groupings of fixtures 14 to be established within the lighting network yet controlled through a single discrete input pin. All of these features are also programmable for use with the serial communications port, allowing complex groups of fixtures 14 to be controlled using a single data bus command. The available configurations simplify the process of interfacing the lighting network to existing or new control systems. These configurations include the ability to control the lighting in relation to the length of the switch closure, various intensity control settings, transition through various triggered, user-defined level inputs, brightness control by variable voltage, and many other features.

Referring again to FIG. 2, a particular implementation of a lighting network according to a preferred embodiment of the present invention may be described. In the illustrated configuration, an aircraft cabin has four light fixtures 14—left-hand upwash lights 50, left-hand downwash lights 52, right-hand upwash lights 54, and right-hand downwash lights 56. Each fixture 14 is of the nine-inch variety, and comprises three light modules 28 each three inches long. Power to each of the fixtures 14 in FIG. 2 is provided through one of two PCUs 30, with each PCU 30 powering the fixtures 14 on one side of the cabin. Network control signals 34 feed into PCUs 30 at network control inputs 32. Power (and ground) feeds 36 enter PCUs 30 at power inputs 38. Both power and data signals are output from PCUs 30 at outputs 40 to fixtures 14 over buses 42. An optional interconnection bus 44 allows PCUs 30 to connect to additional elements in the lighting system or to other PCUs 30.

The present invention has been described with reference to certain preferred and alternative embodiments that are intended to be exemplary only and not limiting to the full scope of the present invention as set forth in the appended claims.

What is claimed is:

1. A lighting assembly, comprising:
    (a) a plurality of lighting fixtures each comprising a fixture electrical contact;
    (b) a mounting member comprising an elongated rail supporting each of said plurality of lighting fixtures; and
    (c) a cable, wherein said cable comprises a plurality of cable electrical contacts, and said cable is fitted between said elongated rail and said lighting fixtures such that each of said fixture electrical contacts is held in frictional contact with one of said cable electrical contacts.

2. The lighting assembly of claim 1, wherein said lighting fixtures are abutted end to end, said lighting fixtures are operable to produce a light, and said light from said lighting fixtures is uniform in intensity across said lighting fixtures.

3. The lighting assembly of claim 1, further comprising a power conditioning unit in electrical connection with said cable.

4. The lighting assembly of claim 1, wherein said lighting fixtures each comprises at least two of the set of an LED operable to produce red light, an LED operable to produce green light, and an LED operable to produce blue light.

5. The lighting assembly of claim 1, wherein said cable comprises cable locking tabs, said mounting member comprises cut-outs, and said cable is locked into place within said mounting member by insertion of said cable locking tabs into said mounting member cut-outs.

6. The lighting assembly of claim 5, wherein said fixtures comprise locking pins, said mounting member comprises apertures sized to receive said fixture locking pins, and said fixtures are locked into place against said mounting member by insertion of said fixture pins into said mounting member apertures.

7. The lighting assembly of claim 1, further comprising:
(a) a communications network; and
(b) a processor in electrical communication with said cable through said communications network.

8. The lighting assembly of claim 7, comprising a plurality of cables, and wherein said processor is in electrical communication with each of said cables through said communications network.

9. A lighting assembly, comprising:
(a) a lighting fixture comprising a fixture power contact, a fixture ground contact, and a fixture signal contact;
(b) a mounting member supporting said lighting fixture; and
(c) a cable, wherein said cable comprises a cable electrical contact, a cable around contact, and a cable signal contact, and said cable power contact is held in frictional contact with said fixture power contact; said cable ground contact is held in frictional contact with said fixture ground contact; and said cable signal contact is held in frictional contact with said fixture signal contact.

10. The lighting assembly of claim 9, wherein said fixture is operable to produce a light; and wherein said fixture comprises a controller, wherein said controller is operable to vary the intensity and color of the light produced by said fixture in response to a signal passed from said cable through said cable signal contact to said fixture signal contact.

11. The lighting assembly of claim 10, wherein said assembly comprises a plurality of light fixtures, and wherein the intensity and color of the light produced by each said light fixture is independently controllable by each said controller for each said light fixture.

12. A lighting network, comprising:
(a) a processor;
(b) an electronic communications network in electrical communication with said processor;
(c) a power source;
(d) a mounting member;
(e) a flat cable in electrical communication with said electronic communications network and said power source, wherein said cable comprises a cable electrical contact; and
(f) a lighting fixture, wherein said lighting fixture comprises a lighting fixture electrical contact and is removably attached to said mounting member with said lighting fixture electrical contact in frictional contact with said cable electrical contact.

13. The lighting network of claim 12, wherein lighting fixture electrical contact is resilient, and said lighting fixture electrical contact is partially compressed against said cable electrical contact when said lighting fixture is attached to said mounting member.

14. The lighting network of claim 13, wherein said cable comprises two sides, said cable comprises a plurality of cable contacts, and wherein each of said cable contacts lies on the same side of said cable.

15. The lighting network of claim 14, wherein said cable comprises a plurality of cable contacts, said lighting network comprises a plurality of lighting fixtures, and said lighting fixture electrical contact of each of said lighting fixtures is in contact with at least one of said cable contacts.

16. The lighting network of claim 14, wherein said lighting fixture comprises a lighting fixture power contact and a lighting fixture data contact, and said cable comprises a cable power contact and a cable data contact.

17. The lighting network of claim 12, wherein said lighting fixture is operable to produce light, and said processor is operable to generate a control signal onto said electronic communications network, through said cable and to said lighting fixture to manipulate at least one of the intensity and color if the light.

* * * * *